United States Patent
Kim et al.

(10) Patent No.: US 7,008,841 B2
(45) Date of Patent: Mar. 7, 2006

(54) SEMICONDUCTOR DEVICE HAVING METAL-INSULATOR-METAL CAPACITOR AND METHOD FOR FABRICATING THE SAME

(75) Inventors: Sung-Hoon Kim, Suwon-si (KR); Heon-Jong Shin, Yongin-si (KR)

(73) Assignee: Samsung Electronics, Co., Ltd., Suwon (KR)

( * ) Notice: Subject to any disclaimer, the term of this patent is extended or adjusted under 35 U.S.C. 154(b) by 0 days.

(21) Appl. No.: 10/959,788

(22) Filed: Oct. 6, 2004

(65) Prior Publication Data
US 2005/0130369 A1    Jun. 16, 2005

(30) Foreign Application Priority Data
Dec. 10, 2003    (KR) ...................... 10-2003-0089363

(51) Int. Cl.
*H01L 21/8242*    (2006.01)

(52) U.S. Cl. .................... 438/250; 438/3; 438/240

(58) Field of Classification Search .................. 438/3, 438/240, 250
See application file for complete search history.

(56) References Cited

U.S. PATENT DOCUMENTS

| | | | | |
|---|---|---|---|---|
| 6,143,601 A | * | 11/2000 | Sun ............................. | 438/253 |
| 6,329,234 B1 | * | 12/2001 | Ma et al. .................... | 438/210 |
| 6,342,734 B1 | * | 1/2002 | Allman et al. .............. | 257/758 |
| 6,391,707 B1 | | 5/2002 | Dirnecker et al. .......... | 438/250 |
| 6,645,810 B1 | * | 11/2003 | Ng et al. ..................... | 438/253 |
| 6,774,425 B1 | * | 8/2004 | Lachner et al. ............. | 257/306 |
| 6,893,935 B1 | * | 5/2005 | Lachner ...................... | 438/396 |

FOREIGN PATENT DOCUMENTS

| KR | 1020020025317 A | 4/2002 |
|---|---|---|
| KR | 1020030049564 A | 6/2003 |

* cited by examiner

*Primary Examiner*—Jennifer Kennedy
(74) *Attorney, Agent, or Firm*—F. Chau & Associates, LLC (57) ABSTRACT

In a semiconductor device including a metal-insulator-metal (MIM) capacitor and a method for fabricating the same, a first metal layer and a dielectric film are sequentially formed on an insulating layer. The dielectric film is patterned, wherein a remaining portion is incorporated into the MIM capacitor, and a second metal layer is formed on the patterned dielectric film and the first metal layer. The second metal layer, the patterned dielectric film, and the first metal layer are patterned at one time. Interconnects are formed by stacking the first and the second metal layers when forming the MIM capacitor, which includes a lower electrode formed of the first metal layer, the dielectric film, and an upper electrode formed of the second metal layer.

15 Claims, 5 Drawing Sheets

SEMICONDUCTOR DEVICE HAVING METAL-INSULATOR-METAL CAPACITOR AND METHOD FOR FABRICATING THE SAME

BACKGROUND OF THE INVENTION

1. Field of the Invention

The present invention relates to a semiconductor device and a method for fabricating the same, and more particularly to a semiconductor device having a metal-insulator-metal (MIM) capacitor including multiple metal lines, and a method for fabricating the same.

2. Description of Related Art

Methods for integrating capacitors having large capacitance in semiconductor devices have been studied for increasing the performance of analog circuits and radio frequency (RF) devices needing high-speed operation. When a lower electrode and an upper electrode of a capacitor are formed of a doped polysilicon, a natural oxide layer is produced by an oxidation reaction occurring at interfaces between the lower electrode and a dielectric film and between the dielectric film and the upper electrode, thereby decreasing the capacitance. A capacitor having a metal-insulator-silicon (MIS) or a metal-insulator-metal (MIM) structure may be used to prevent this decrease in capacitance. MIM capacitors are typically employed in high performance semiconductor devices because MIM capacitors exhibit low specific resistance and a lack of parasitic capacitance caused by depletion.

Figure 1:
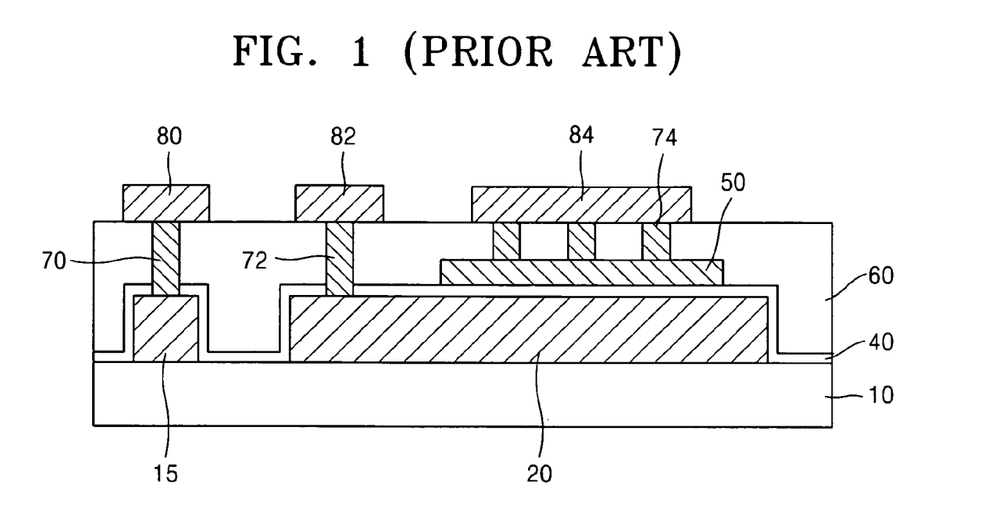
FIG. 1 is a sectional view for illustrating a method for fabricating a semiconductor device including a MIM capacitor.

In a method for fabricating a semiconductor device having a MIM capacitor, as shown in FIG. 1, a metal layer of about 6000 Å is formed on an insulating layer 10. The metal layer is patterned to form a lower metal line 15 and a lower electrode 20 of the MIM capacitor at the same level. A dielectric film 40 is coated thereon. A metal is deposited over the dielectric film 40 to a thickness of more than 1500 Å and patterned to form an upper electrode 50 on the dielectric film 40. An inter-metal-dielectric (IMD) layer 60 is formed on the dielectric film 40 and the upper electrode 50. A first via 70 connected to the lower metal line 15, a second via 72 connected to the lower electrode 20, and a third via 74 connected to the upper electrode 50 are formed in the IMD layer 60. A metal is deposited to a thickness of about 3000 Å on the IMD layer 60. The metal is patterned thereby forming upper metal lines 80, 82, and 84 respectively connected to the first, second, and third vias 70, 72, and 74.

The step of forming the upper dielectric includes a plasma etch which damages the surface of the dielectric film 40 since the upper electrode 50 is patterned over the dielectric film 40. Further, since the depth of the first and second vias 70 and 72 differs from that of the third via 74, an etching process with a significantly high selectivity is needed. If the first and second vias 70 and 72, and the third via 74 are formed separately, another mask is needed, thereby complicating the etching process.

When a single mask process is used, since the depth of the first and second vias 70 and 72 is greater than the depth of the third via 74, the upper electrode 50 underlying the third via 74 is over etched. The dielectric film 40 may be damaged and the underlying lower electrode 20 is exposed by the etch, so that an electric short is likely to occur between the upper electrode 50 and the lower electrode 20 once the upper metal lines 82 and 84 are respectively connected to the second and third vias 72 and 74. Because the over etch is affected by variable factors in the single mask process, the contact resistances of the vias may differ among devices or among the vias in a device, thus increasing the dispersion of characteristics of devices.

Therefore, a need exists for an upper electrode formed with a thickness sufficient to withstand etching of an IMD layer for forming a third via.

SUMMARY OF THE INVENTION

According to an embodiment of the present disclosure, a method for fabricating a semiconductor device comprising a MIM capacitor reduces characteristic dispersion of the device without damaging a dielectric film.

According to an embodiment of the present disclosure, a semiconductor device comprising a MIM capacitor exhibits uniformly excellent characteristics.

According to an embodiment of the present disclosure, there is provided a method for fabricating a semiconductor device, in which a first metal layer and a dielectric film are sequentially formed on an insulating layer. The dielectric film is patterned forming a patterned dielectric film. A second metal layer is formed on the patterned dielectric film and first metal layer. The second metal layer, the patterned dielectric film, and the first metal layer are patterned simultaneously to form interconnects including the first and second metal layers on a first portion of the semiconductor device. Simultaneously, the MIM capacitor is patterned including a lower electrode formed of the first metal layer, the dielectric film, and an upper electrode formed of the second metal layer on a second portion of the semiconductor device.

According to an embodiment of the present disclosure, there is provided a method for fabricating a semiconductor device, in which a first lower interconnect and a second lower interconnect are formed on an insulating layer. A first inter-metal-dielectric (IMD) layer is formed over the lower interconnects and insulating layer and planarized. A first via penetrating through the first IMD layer connected to the first lower interconnect is formed while forming second and third vias connected to the second lower interconnect. A first metal layer and a dielectric film are sequentially formed on the first IMD layer, including the first, the second, and the third vias. The dielectric film is patterned to remain on a portion of the first metal layer above the third via. The second metal layer, the dielectric film, and the first metal layer are patterned simultaneously to form a first interlayer interconnect connected to the first via and including the first and the second metal layers, and a second interlayer interconnect connected to the second via and including the first and the second metal layers. Simultaneously, a metal-insulator-metal (MIM) capacitor is patterned connected to the third via, the MIM capacitor including a lower electrode formed of the first metal layer, the dielectric film and an upper electrode formed of the second metal layer. After forming a second IMD layer over the first and second interlayer interconnects and MIM capacitor, a fourth via connected to the first interlayer interconnect, a fifth via connected to the second interlayer interconnect, and a sixth via connected to the upper electrode are formed. Upper interconnects respectively connected to the fourth, the fifth, and the sixth vias are formed on the second IMD layer.

According to an embodiment of the present disclosure, there is provided a semiconductor device including interconnects and a metal-insulator-metal (MIM) capacitor formed parallel with one another on an insulating layer. The interconnects are respectively formed by a first metal layer pattern and a second metal layer pattern sequentially stacked from the surface of the insulating layer. The MIM capacitor includes a lower electrode, a dielectric film and an upper electrode sequentially stacked from the surface of the insulating layer. In this structure, the lower electrode is formed of a material identical to that of the first metal layer pattern and having the same thickness as the first metal layer pattern, and the upper electrode is formed of a material identical to that of the second metal layer pattern and having the same thickness as the second metal layer pattern.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF PREFERRED EMBODIMENTS

Preferred embodiments of the present invention will now be described with reference to the drawings, wherein like reference numerals are used to refer to like elements throughout. It should be understood that the description of these embodiments are merely illustrative and that they should not be taken in a limiting sense. In the following description, for purposes of explanation, numerous specific details are set fourth to provide a thorough understanding of the present invention. It will be evident to one skilled in the art, however, that the present invention may be practiced without these specific details.

FIGS. 2 to 6 are sectional views for illustrating a semiconductor device including a MIM capacitor and a method for fabricating the same according to an embodiment of the present disclosure.

Figure 2:
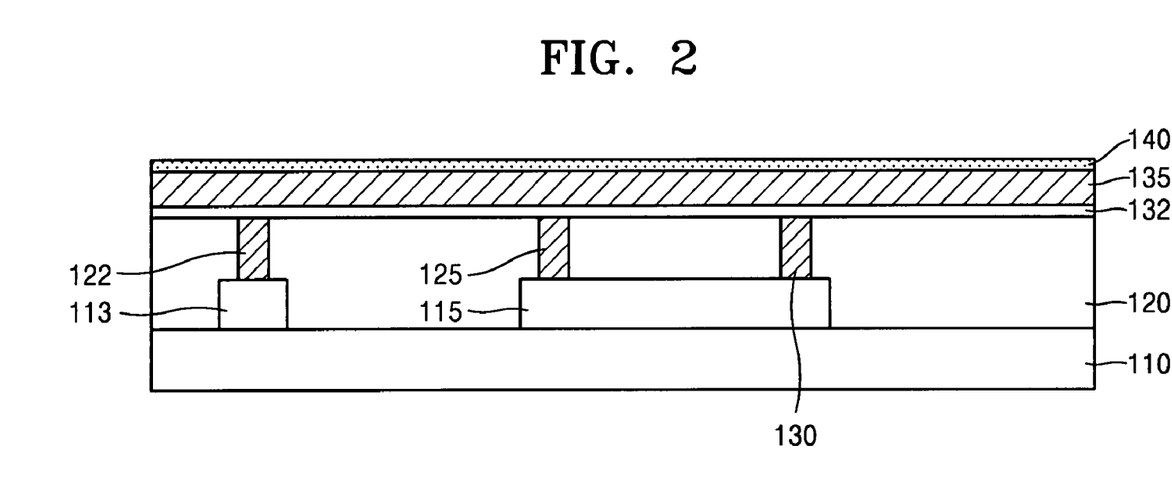
FIGS. 2 to 6 are sectional views for illustrating a semiconductor device including a MIM capacitor and a method for fabricating the same according to an embodiment of the present disclosure.

Referring to FIG. 2, lower interconnects 113 and 115 made of a metal, e.g., aluminium (Al), are formed on an insulating layer 110, and a first IMD layer 120 is coated thereon and planarized. The planarization is performed by using, for example, chemical mechanical polishing (CMP). The insulating layer 110 may be an IMD layer for separating multilayer interconnects (not shown). Other elements and a substrate underlying the insulating layer 110 are omitted from FIG. 2 for brevity. The insulating layer 110 and/or the first IMD layer 120 may be formed of a tetra ethyl ortho silicate (TEOS), fluorinated silicon oxide (SiOF) or silicon oxycarbide (SiOC). For example, the TEOS layer may be formed via chemical vapor deposition (CVD) using the TEOS source gas. The SiOF layer may be formed via high density plasma (HDP)-CVD using silicon hydride ($SiH_4$) gas, silicon tetrafluoride ($SiF_4$) gas, oxygen ($O_2$) gas and argon (Ar) gas. The SiOC layer may be formed by coating an organic Spin On Glass (SOG) layer that is then baked.

A first via 122 penetrates through first IMD layer 120 to be connected to the first lower interconnect 113, and second and third vias 125 and 130 are connected to the second lower interconnect 115. The first IMD layer 120 is etched by using $C_xF_y$ gas, e.g., tetrafluoromethane ($CF_4$), hexafluoropropylene ($C_3F_6$) and octafluorocyclobutane ($C_4F_8$), to form the via holes, and a conductive layer, e.g., a tungsten (W) layer, is buried to form the first, the second, and the third vias 122, 125, and 130.

A capping layer 132, e.g., a titanium (Ti) layer, is formed on the first IMD layer 120, which includes the first, the second, and the third vias 122, 125, and 130, to a thickness of about 300 Å to 600 Å via CVD or physical vapor deposition (PVD) such as sputtering. The capping layer 132 serves as a diffusion-stop layer for preventing a metal element from diffusing into the first IMD layer 120.

A first metal layer 135 is formed having a thickness less than the lower electrode of the conventional capacitor, e.g., about half thereof. The first metal layer 135 may be Al deposited to a thickness of about 3000 Å.

A dielectric film 140 is formed over the first metal layer 135. A silicon nitride layer or silicon carbide layer may be provided as the dielectric film 140 via a plasma enhanced CVD (PECVD) method. The thickness thereof may be about, for example, 600 Å. The kind and thickness of the dielectric film 140 may be adjusted in view of the desired capacitance of the capacitor.

Figure 3:
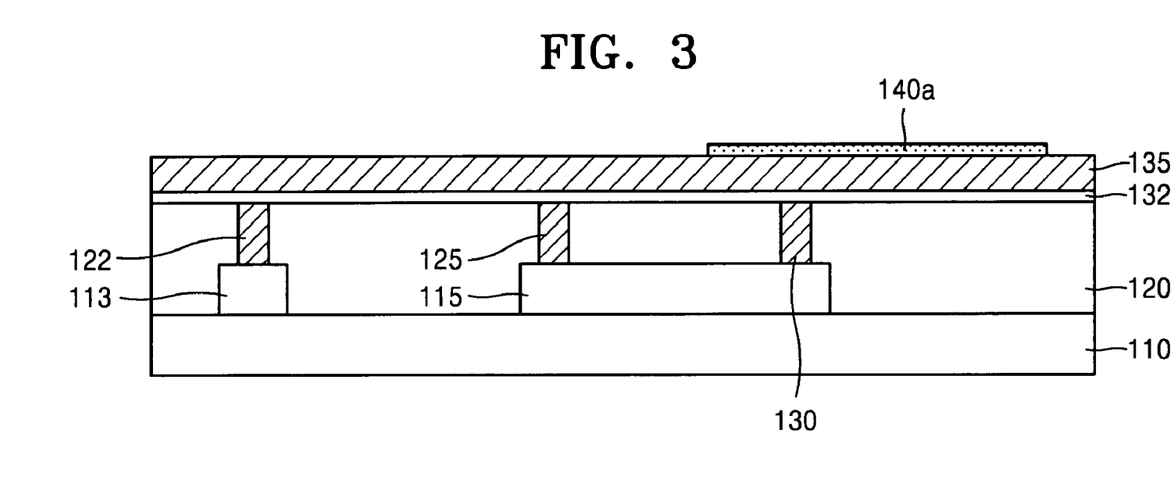

Thereafter, as shown in FIG. 3, the dielectric film 140 is patterned such that a portion of the dielectric film 140a remains on an upper side of the third via 130.

Figure 4:
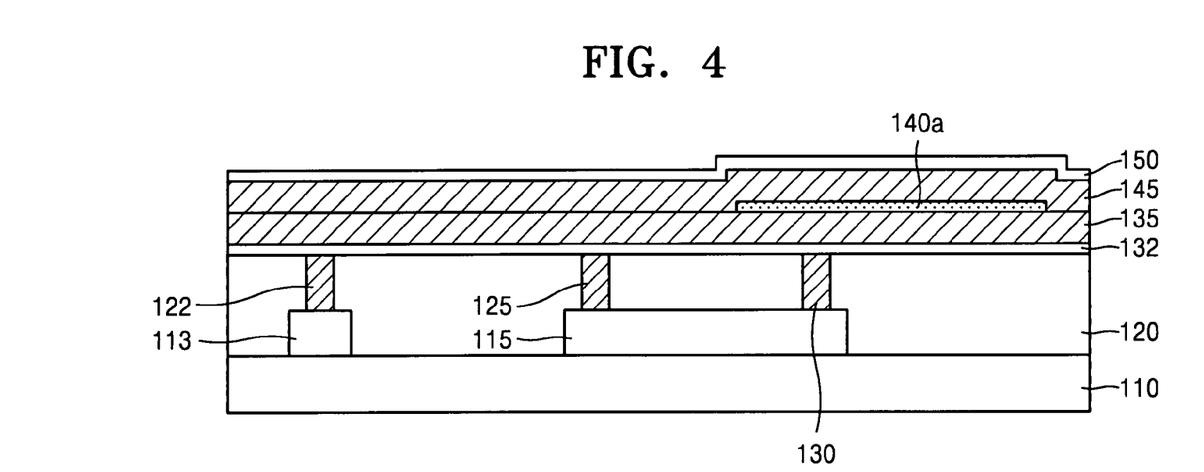

With reference to FIG. 4, a second metal layer 145 is formed on the dielectric film 140a and the first metal layer 135, wherein the second metal layer 145 and the first metal layer 135 have a combined thickness of about 6000 Å. For example, Al is deposited to a thickness of about 3000 Å to form the second metal layer 145. The first and the second metal layers 135 and 145 may be formed to have the same thickness. The first and the second metal layers 135 and 145 are patterned to form a lower electrode and an upper electrode of the capacitor, respectively. Accordingly, the first and second metal layers 135 and 145 having substantially similar thicknesses form the lower electrode and the upper electrode of the capacitor having substantially similar thicknesses, thereby providing uniform device. The first and the second metal layers 135 and 145 may be formed to have different thicknesses. Also, the first metal layer and the second metal layer 135 and 145 may be formed of different materials. For example, the first metal layer 135 may be formed of Al, and the second metal layer 145 may be formed of titanium/titanium nitride (Ti/TiN) or TiN. When second metal layer 145 is formed of Al, an anti-reflection layer 150, e.g., a TiN layer, is preferably formed on the upper portion of the second metal layer 145 to a thickness of about 600 Å for the purpose of patterning the second metal layer 145. The anti-reflection layer 150 decreases irregular reflections of the metal layer to facilitate a photolithography process of the metal layer. The anti-reflection layer 150 may be omitted, and furthermore is not needed when the second metal layer 145 is formed of Ti/TiN or TiN. In case of forming the second material layer 145 of Ti/TiN, a capping material 132 such as Ti is deposited prior to the TiN to prevent reflection.

Figure 5:
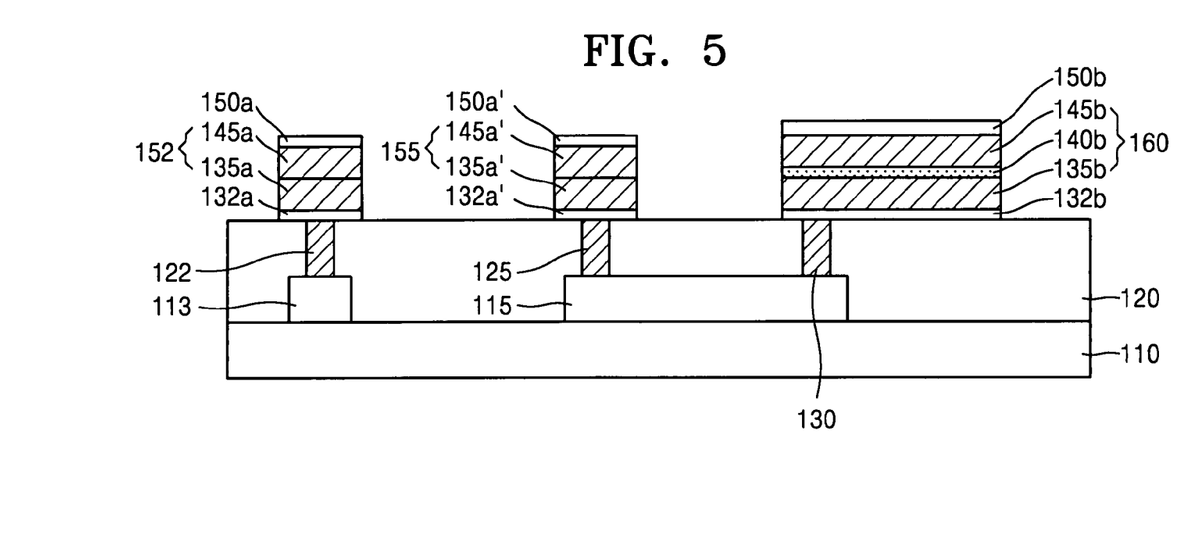

Referring to FIG. 5, the anti-reflection layer 150, the second metal layer 145, the dielectric film 140a, first metal layer 135, and the capping layer 132 are patterned together to form a first interlayer interconnect 152 connected to the first via 122, a second interlayer interconnect 155 connected to the second via 125, and a MIM capacitor 160 connected to the third via 130.

The first interlayer interconnect 152 is formed to include a first portion of the first metal layer pattern 135a and a first portion of the second metal layer pattern 145a. The second interlayer interconnect 155 is formed to include a second portion of the first metal layer pattern 135a' and a second portion of the second metal layer pattern 145a'. The capping layer patterns 132a and 132a' and anti-reflection layer patterns 150a and 150a' are respectively positioned below the lower plane and on the upper plane of the first and second interlayer interconnects 152 and 155.

The MIM capacitor 160 includes lower electrode 135b formed of a third portion of the first metal layer pattern 135b, dielectric film 140b and upper electrode 145b formed of a third portion of the second metal layer pattern. A capping layer pattern 132b and the anti-reflection layer pattern 150b are respectively positioned below a lower plane and on an upper plane of the MIM capacitor 160.

Referring to FIG. 5, a step between the regions formed with and without the MIM capacitor is as high as the thickness of the dielectric film 140b. The thickness of the dielectric film 140b is approximately 600 Å. Thus, the step between the regions formed with and without the MIM capacitor according to the present disclosure can be less than about 600 Å.

The areas of the lower electrode 135b and the upper electrode 145b of the MIM capacitor 160 are equal to one another. The lower electrode 135b and the upper electrode 145b of the MIM capacitor 160 may be formed to have the same thickness. As a result, in case of the semiconductor device according to an embodiment of the present disclosure, the lower electrode 135b and the upper electrode 145b not only occupy the same area but also have the same thickness. Thus, the semiconductor device exhibits uniform characteristics.

When the anti-reflection layer 150, the second metal layer 145, the dielectric film 140a, the first metal layer 135, and the capping layer 132 are patterned, patterning is executed by activating a gas mixture of $Cl_2$ and $BCl_3$ using a plasma. Because the second metal layer 145, the dielectric film 140a, and the first metal layer 135 are patterned simultaneously the surface of the dielectric film 140a is not damaged by the plasma during the etching process.

Figure 6:
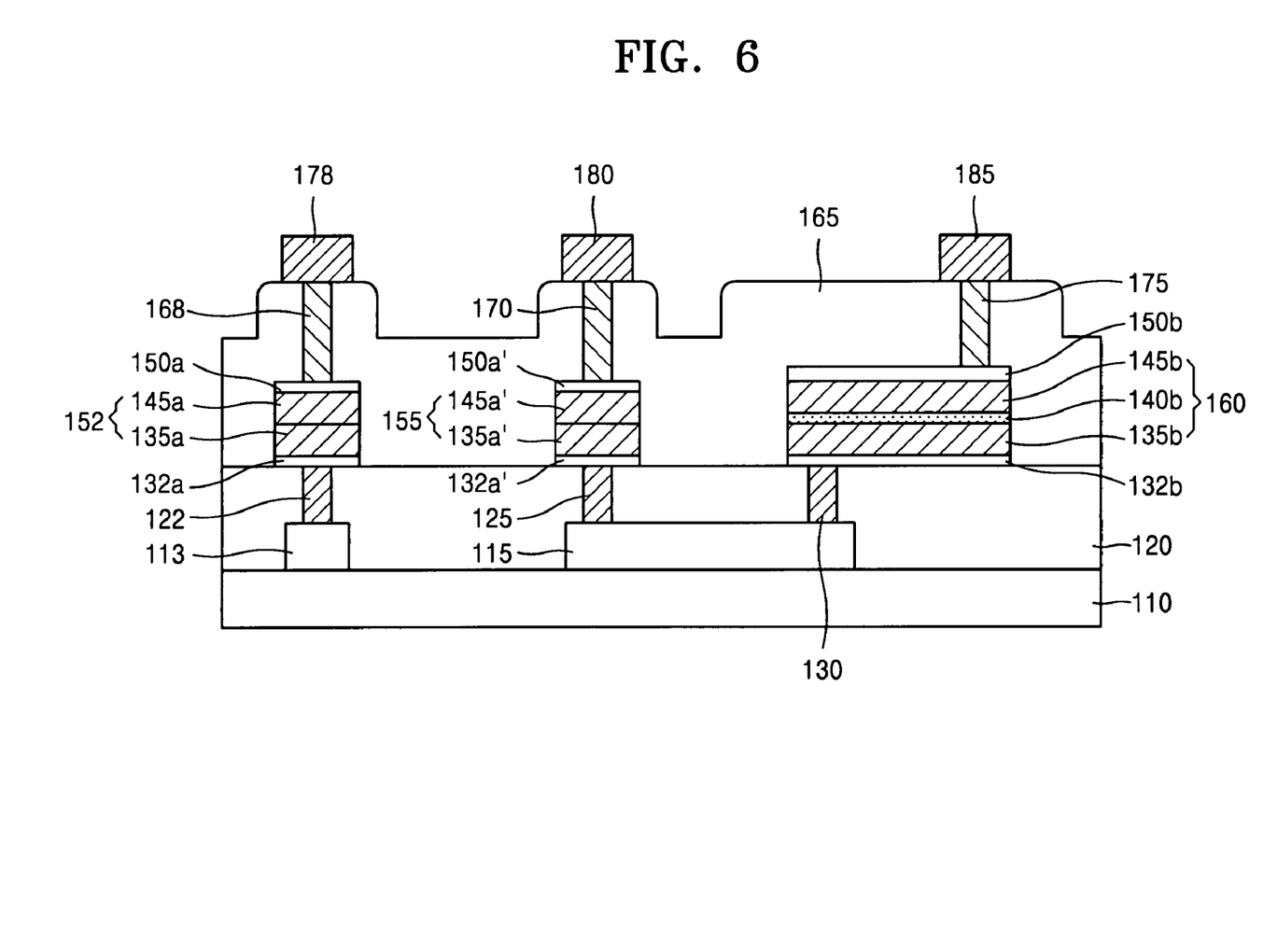

Referring now to FIG. 6, a second IMD layer 165 is formed. The second IMD layer 165 may be, for example, a TEOS layer, a SiOF layer or SiOC layer. A fourth via 168 connected to the first interlayer interconnect 152, and a fifth via 170 connected to the second interlayer interconnect 155 are formed. The fifth via 170 is connected to the lower electrode 135b. A sixth via 175 connected to the upper electrode 145b is formed.

Referring to FIG. 6, the fifth via 170 connected to the lower electrode 135b and the sixth via 175 connected to the upper electrode 145b differ in depth from each other by the thickness of the dielectric film 140b. The depth difference between the fifth and the sixth vias 170 and 175 is insignificant as compared with that in the conventional one. Therefore, when the fifth via 170 and sixth via 175 are etched, the sixth via 175 has a depth less than the fifth via 170, and over etching of the upper electrode 145b is less likely to occur. Therefore, possibility of an electric short induced between the upper electrode 145b and the lower electrode 135b is reduced. Since the over-etched amount can be decreased, the problem of different contact resistances of the vias among devices and among each other in a single device can be reduced. Therefore, the dispersion of the device characteristics can be decreased.

If the second IMD layer 165 is the uppermost insulating layer, there is no need to perform planarization thereof. Otherwise, the second IMD layer 165 may be planarized prior to forming the fourth, the fifth, and the sixth vias 168, 170, and 175 for the purpose of performing a subsequent metallization process. Even though the planarization is needed, it is easier than the conventional planarization because the step formed between the regions formed with and without the MIM capacitor is as thick as the thickness of the dielectric film 140b.

A metal is deposited and patterned on the second IMD layer 165 including the fourth, the fifth, and sixth vias 168, 170, and 175, thereby forming the upper interconnects 178, 180, and 185 respectively connected to the fourth, the fifth and the sixth vias 168, 170, and 175.

The MIM capacitor according to an embodiment of the present disclosure may be used as a capacitor in a RF device. Therefore, the kinds of the metal layers for forming the lower interconnects 113 and 115, the first and the second metal layers 135 and 145, and the upper interconnects 178, 180, and 185 may be selected by considering the frequency band of the RF device. For example, if the frequency band is 2.4 GHz, Al may be selected. For a frequency band above 15 GHz, tungsten or copper may be employed. When copper is used, respective vias and interconnects may be formed as a single damascene or dual damascene.

As shown in FIG. 6, the semiconductor device according to an embodiment of the present disclosure includes the first and the second interlayer interconnects 152 and 155 and the MIM capacitor 160 formed parallel with one another on the insulating layer, i.e., the first IMD layer 120. The first interlayer interconnect 152 includes the first metal layer pattern 135a and the second metal layer pattern 145a sequentially stacked on the surface of the first IMD layer 120. Similarly, the second interlayer interconnect 155 includes another first metal layer pattern 135a' and another second metal layer pattern 145a' sequentially stacked from the surface of the first IMD layer 120. The MIM capacitor 160 includes the lower electrode 135b, the dielectric film 140b, and the upper electrode 145b sequentially stacked on the surface of the first IMD layer 120, in which the lower electrode 135b is formed of a material identical to that of the first metal layer patterns 135a and 135a' and with the same thickness. The upper electrode 145b is formed of a material identical to that of the second metal layer patterns 145a and 145a' and with the same thickness.

The capping layer patterns 132a, 132a' and 132b are further provided between the first IMD layer 120 and the first metal layer patterns 135a and 135a' and between the first IMD layer 120 and the lower electrode 135b. However, the capping layer patterns 132a, 132a' and 132b may be omitted. Additionally, anti-reflection layer patterns 150a, 150a' and 150b further formed on second metal layer patterns 145a and 145a' and upper electrode 145b may also be omitted, or may be omitted when the second metal layer patterns 145a and 145a' and the upper electrode 145b are formed of Ti/TiN or TiN. The first metal layer patterns 135a and 135a' and the second metal layer patterns 145a and 145a' may have the same or different thicknesses. Because the first and the second interlayer interconnects 152 and 155 and the MIM capacitor 160 are formed by a patterning process simultaneously, the first metal layer pattern 135a and the second metal layer pattern 145a have the same width. Additionally, the first metal layer pattern 135a' and the second metal layer pattern 145a' have the same width, and the lower electrode 135b, the dielectric film 140b and the upper electrode 145b have the same width.

The lower interconnect 115 and the second and the third vias 125 and 130 make a structure for electrically connecting the second interlayer interconnect 155 and the lower electrode 135b of the MIM capacitor 160 within the first IMD layer 120. Similarly, the fifth and the sixth vias 170 and 175 and the upper interconnects 180 and 185 constitute a structure to connect the second interlayer interconnect 155 and the upper electrode 145b of the MIM capacitor 160 to the outside of the semiconductor device.

Figure 7:
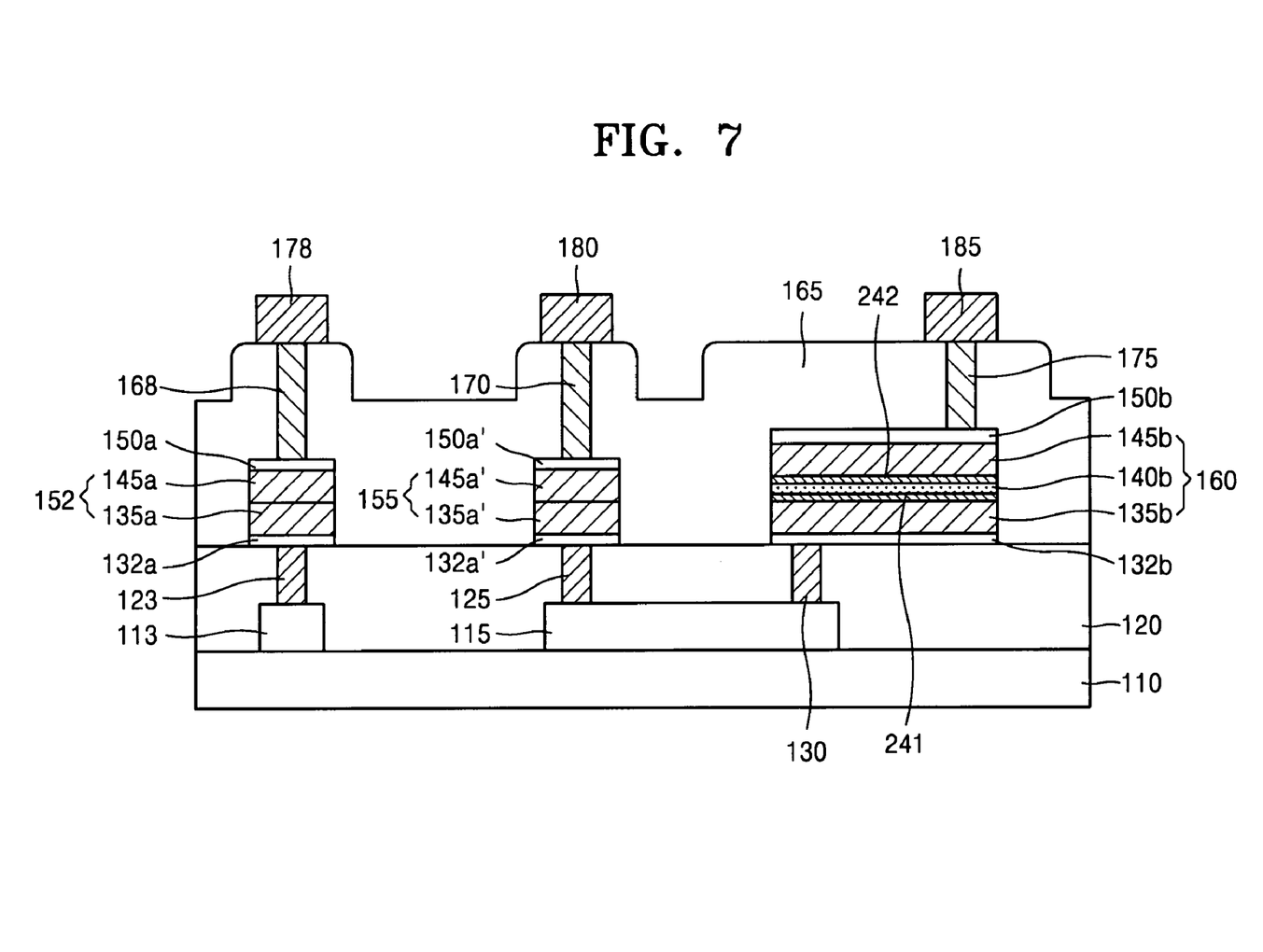
FIG. 7 is a sectional view for illustrating a semiconductor device including a MIM capacitor and a method for fabricating the same according to an embodiment of the present disclosure.

FIG. 7 is a sectional view for illustrating a semiconductor device including the MIM capacitor according to an embodiment of the present disclosure, and a method for fabricating the same.

A buffer layer, e.g., TiN layer, is formed before or after forming the dielectric film 140, which is described with reference to FIG. 3. The resultant structure as shown in FIG. 7 is obtained after carrying out the processes as shown in FIGS. 4, 5, and 6. Referring to FIG. 7, buffer layers 241 and 242 are further provided on a lower plane and an upper plane of the dielectric film 140b. The buffer layer 241 formed on the lower plane of the dielectric film 140b serves for blocking diffusion of the metal element from the lower electrode 135b. The buffer layer 242 formed on the upper plane of the dielectric film 140b serves as an anti-reflection layer in the photolithography process of remaining dielectric film 140a on an upper side of the third via formed by patterning the dielectric film 140.

The process for forming the conventional MIM capacitor is executed after forming the lower electrode at the same level as the lower metal line. However, in the method for fabricating the semiconductor device according to an embodiment of the present disclosure, the deposition of the metal layer that forms the lower electrode of the conventional MIM capacitor is performed twice, and the dielectric film is formed on a predetermined region, to be formed with the MIM capacitor thereon, between the depositing steps. Once the sandwiched metal-dielectric film-metal structure is subjected to patterning, it is possible to form the metal interconnect without interposing the dielectric film on one side and to form the MIM capacitor including the upper electrode, the dielectric film and the lower electrode on the other side by performing patterning once. Therefore, the dielectric film is not damaged by patterning the upper electrode after forming the dielectric film.

The MIM capacitor is formed at the same level during forming the metal line. Thus, consistent contact resistance can be realized owing to the depths of the vias respectively connected to the lower electrode and upper electrode, and improved characteristic dispersion can be achieved. Furthermore, the thicknesses and areas of the upper electrode and lower electrode are substantially equal, thereby realizing uniform characteristics of the device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method for fabricating a semiconductor device, the method comprising:
   sequentially forming a first metal layer and a dielectric film on an insulating layer;
   patterning the dielectric film forming a patterned dielectric film;
   forming a second metal layer on the patterned dielectric film and the first metal layer; and
   patterning the second metal layer, the patterned dielectric film and the first metal layer simultaneously to form interconnects including the first and second metal layers on a first portion of the semiconductor device and, simultaneously forming the metal-insulator-metal (MIM) capacitor including a lower electrode formed of the first metal layer, the dielectric film, and an upper electrode formed of the second metal layer on a second portion of the semiconductor device.

2. The method of claim 1, further comprising forming a capping layer between the insulating layer and the first metal layer.

3. The method of claim 1, further comprising forming buffer layers on a lower plane and an upper plane of the dielectric film.

4. The method of claim 3, wherein the buffer layer is a TiN layer.

5. The method of claim 1, wherein the first and second metal layers are made of the same material.

6. The method of claim 5, wherein the first and the second metal layers are formed to have the same thickness.

7. The method of claim 5, further comprising forming an anti-reflection layer on the second metal layer.

8. The method of claim 1, wherein the first metal layer is made of aluminum (Al), and the second metal layer is made of Ti/TiN or TiN.

9. The method of claim 1, further comprising forming a structure within the insulating layer for electrically connecting any one of the interconnects with the lower electrode of the MIM capacitor.

10. A method for fabricating a semiconductor device, the method comprising:
   forming a first lower interconnect and a second lower interconnect on an insulating layer;
   forming a first inter-metal-dielectric (IMD) layer over the lower interconnects and insulating layer;
   forming a first via in the first IMD layer connected to the first lower interconnect, and a second via and a third via in the first IMD layer connected to the second lower interconnect;
   sequentially forming a first metal layer and a dielectric film on the first IMD layer including the first, the second, and the third vias;
   patterning the dielectric film to remain on at least a portion of the first metal layer above the third via;
   forming a second metal layer on the dielectric film and the first metal layer;
   patterning the second metal layer, the dielectric film, and the first metal layer simultaneously to form a first interlayer interconnect comprising the first and the second metal layers connected to the first via, a second interlayer interconnect comprising the first and the second metal layers connected to the second via, and a metal-insulator-metal (MIM) capacitor connected to the third via, wherein the MIM capacitor comprises a lower electrode formed of the first metal layer, the dielectric film, and an upper electrode formed of the second metal layer;
   forming a second IMD layer over the first and the second interlayer interconnects and the MIM capacitor;
   forming a fourth via connected to the first interlayer interconnect, a fifth via connected to the second interlayer interconnect and a sixth via connected to the upper electrode of the MIM capacitor; and
   forming upper interconnects on the second IMD layer to be respectively connected to the fourth, fifth, and sixth vias.

11. The method of claim 10, wherein the first IMD layer is planarized.

12. The method of claim 10, wherein the first metal layer is made of Al, and the second metal layer is made of Ti/TiN or TiN.

13. The method of claim 10, wherein the first and second metal layers are made of the same material.

14. The method of claim 13, further comprising forming buffer layers on a lower plane and an upper plane of the dielectric film.

15. The method of claim 14, wherein the buffer layer is a TiN layer.

* * * * *